US009257481B2

(12) United States Patent
Yang et al.

(10) Patent No.: US 9,257,481 B2
(45) Date of Patent: Feb. 9, 2016

(54) LED ARRRAY INCLUDING LIGHT-GUIDING STRUCTURE

(71) Applicant: Epistar Corporation, Hsinchu (TW)

(72) Inventors: Tsung Hsien Yang, Hsinchu (TW); Yi Tang Lai, Hsinchu (TW); Yao Ning Chan, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 35 days.

(21) Appl. No.: 13/684,769

(22) Filed: Nov. 26, 2012

(65) Prior Publication Data
US 2014/0145222 A1    May 29, 2014

(51) Int. Cl.
| | |
|---|---|
| H01L 33/00 | (2010.01) |
| H01L 27/15 | (2006.01) |
| H01L 33/20 | (2010.01) |
| H01L 33/58 | (2010.01) |
| H01L 25/075 | (2006.01) |
| H01L 33/38 | (2010.01) |
| H01L 33/62 | (2010.01) |

(52) U.S. Cl.
CPC .............. *H01L 27/153* (2013.01); *H01L 33/20* (2013.01); *H01L 25/0753* (2013.01); *H01L 33/38* (2013.01); *H01L 33/58* (2013.01); *H01L 33/62* (2013.01); *H01L 2924/0002* (2013.01); *H01L 2933/0083* (2013.01)

(58) Field of Classification Search
CPC ....................................................... H01L 33/00
USPC ................... 257/93, 94, E33.005; 438/22, 44
See application file for complete search history.

(56) References Cited

U.S. PATENT DOCUMENTS

| | | | | |
|---|---|---|---|---|
| 4,280,273 | A * | 7/1981 | Vincent ........................... | 438/28 |
| 6,946,788 | B2 | 9/2005 | Suehiro et al. | |
| 7,642,108 | B2 | 1/2010 | Krames et al. | |
| 2006/0284195 | A1* | 12/2006 | Nagai ............................. | 257/98 |
| 2007/0176181 | A1* | 8/2007 | Kusunoki ........................ | 257/79 |
| 2010/0019254 | A1* | 1/2010 | Nagai et al. ..................... | 257/88 |
| 2010/0019257 | A1 | 1/2010 | Sakai et al. | |
| 2010/0051977 | A1* | 3/2010 | Kim et al. ....................... | 257/93 |
| 2010/0193813 | A1* | 8/2010 | Kao et al. ........................ | 257/98 |
| 2010/0244053 | A1* | 9/2010 | Dai et al. ........................ | 257/79 |
| 2011/0215350 | A1* | 9/2011 | Song et al. ..................... | 257/93 |
| 2011/0256651 | A1 | 10/2011 | Yan et al. | |

FOREIGN PATENT DOCUMENTS

EP    I291240 B    12/2007

* cited by examiner

*Primary Examiner* — Matthew Gordon
(74) *Attorney, Agent, or Firm* — Ditthavong & Steiner, P.C.

(57) ABSTRACT

An LED array includes: a first LED unit having a first active layer and a first side; a second LED unit having a second active layer and a second side facing the first side; a trench separating the first LED unit from the second LED unit; and a light-guiding structure formed between the first LED unit and the second LED unite for guiding the light emitted by the first active layer and the second active layer away from the LED array.

8 Claims, 10 Drawing Sheets

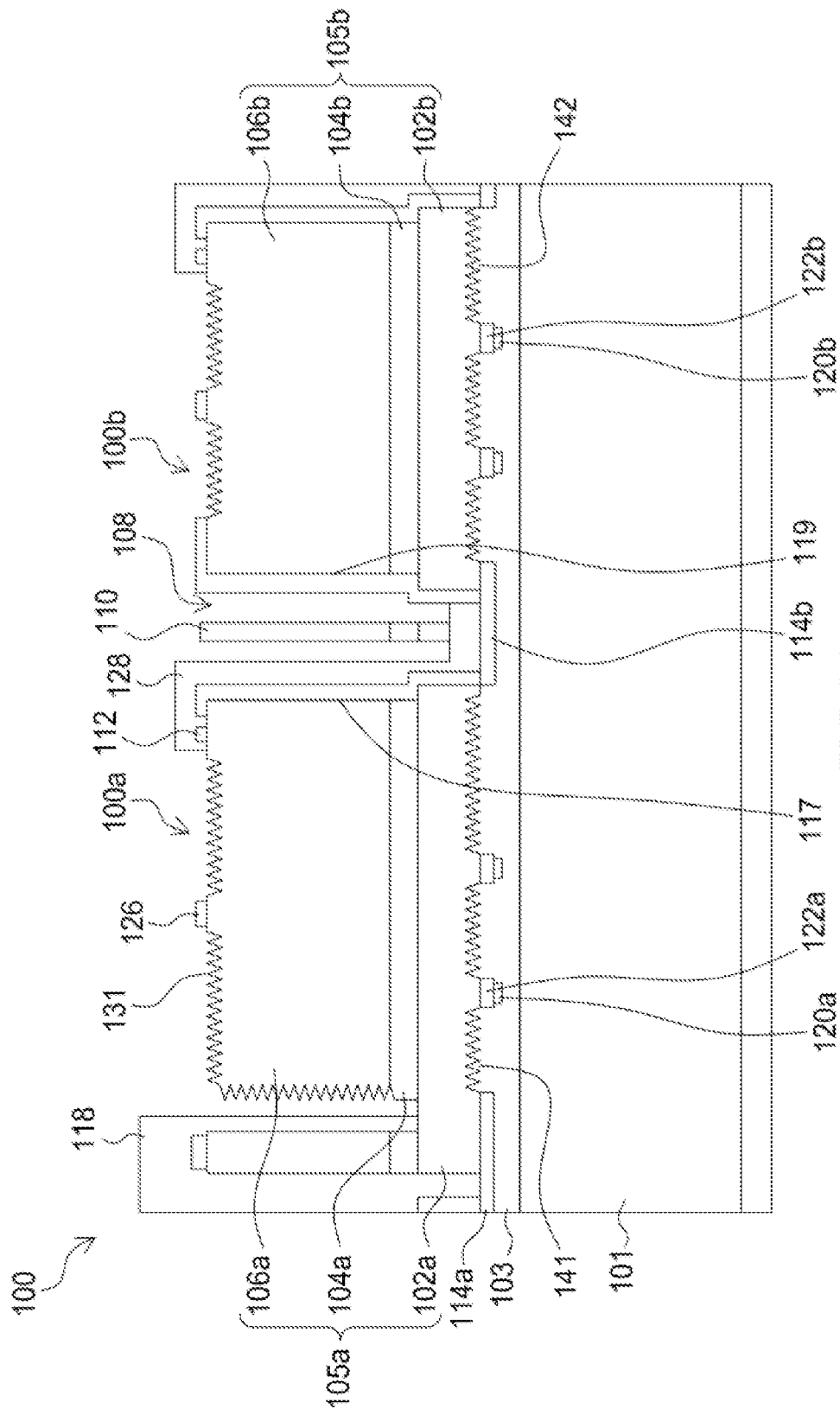

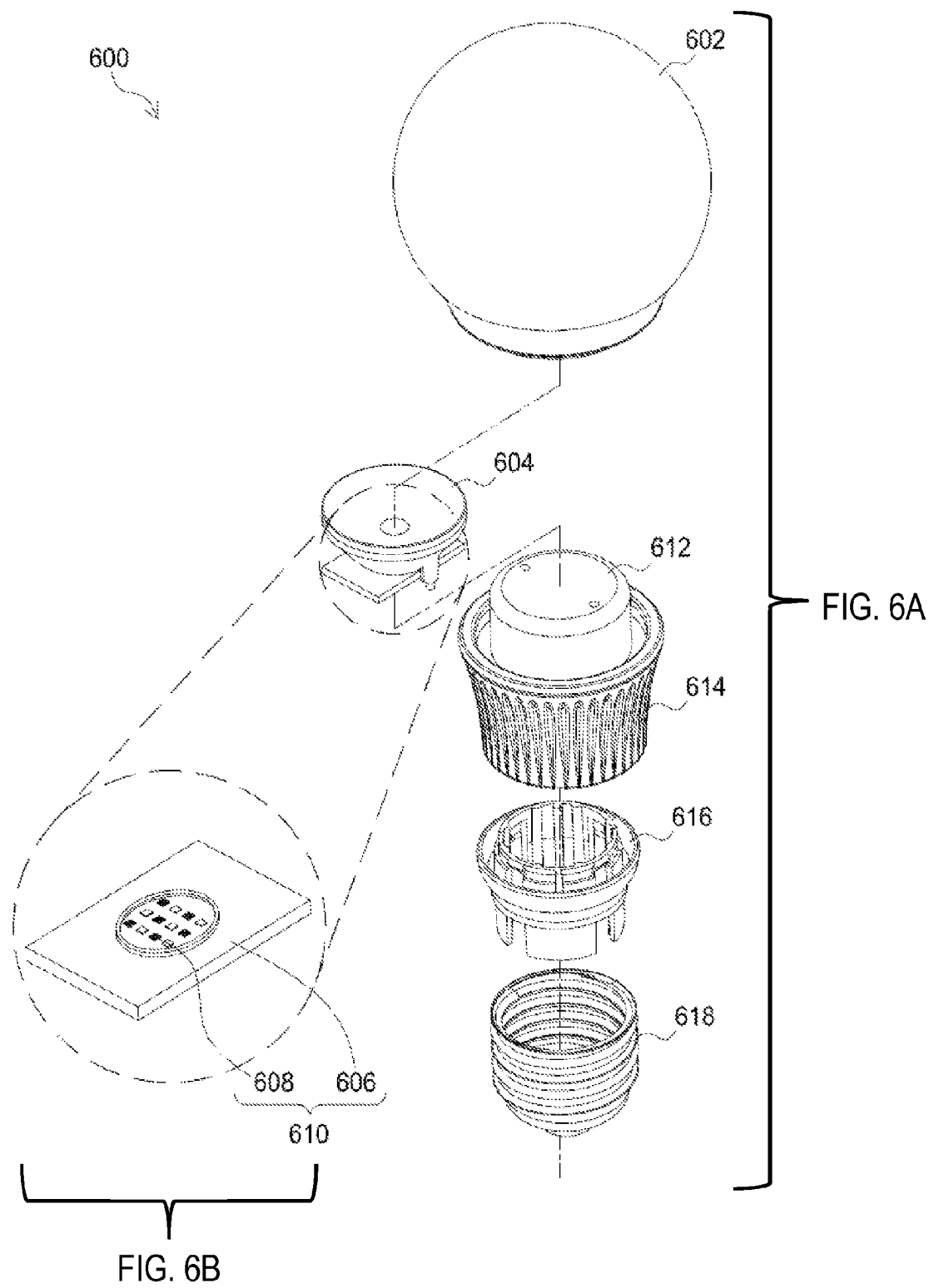

LED ARRRAY INCLUDING LIGHT-GUIDING STRUCTURE

TECHNICAL FIELD

The application relates to an LED array, in particular, relates to an LED array having a light-guiding structure.

DESCRIPTION OF BACKGROUND ART

The lighting theory and structure of light-emitting diode (LED) is different from that of conventional lighting source. An LED has advantages as a low power loss, a long life-time, no need for warming time, and fast responsive time. Moreover, it is small, shockproof, suitable for mass production, so LEDs are widely adopted in the market. For example, LEDs can be used in optical display apparatus, laser diodes, traffic lights, data storage devices, communication devices, illumination devices, medical devices, and so on.

As shown in FIG. 7, a conventional light-emitting array 700 includes: a sapphire substrate 70; a plurality of light-emitting stacks 72 formed on the sapphire substrate 70 and including a p-type semiconductor layer 721, an active layer 722, and an n-type semiconductor layer 723. Because the sapphire substrate 70 is insulative, the light-emitting stacks can be insulated from each other by forming trenches therebetween with etching processes. Furthermore, after partially etching the plurality of light-emitting stacks 72 to the n-type semiconductor layer 723, a first electrode 78 is formed on the exposed area of the n-type semiconductor layer 723, and a second electrode 76 is formed on the p-type semiconductor layer 721. Metal wires 79 are then provided to selectively connect the first electrode 78 and the second electrode 76 to connect the plurality of light-emitting stacks 72 in parallel or series configuration.

In addition, the LED array 700 can be further connected to other components in order to form a light emitting apparatus. The LED array 700 may be mounted onto a submount via the sapphire substrate 70, or a solder bump or a glue material may be formed between the submount and the sapphire substrate 70, therefore a light-emitting apparatus is formed. Besides, the submount further comprises the circuit layout electrically connected to the electrode of the light-emitting array 700 via an electrical conductive structure such as a metal wire.

SUMMARY OF THE DISCLOSURE

An LED array includes: a first LED unit having a first active layer and a first side; a second LED unit having a second active layer and a second side facing the first side; a trench separating the first LED unit from the second LED unit; and a light-guiding structure formed between the first LED unit and the second LED unit for guiding the light emitted by the first active layer and the second active layer away from the LED array.

A light-emitting device includes: a light-emitting stack having a surrounding side; and a plurality of light-guiding channels within the light-emitting stack and formed along the surrounding side, and the shape of top view of one of the light-guiding channels is C-shape.

BRIEF DESCRIPTION OF THE DRAWINGS

FIGS. 1A and 1B show an LED array in accordance with a first embodiment of the present application.

FIG. 6A shows an exploded view of a light bulb having the LED array from any one of the first to fifth embodiment, and FIG. 6B shows an enlarged view of a lighting module of FIG. 6A.

DETAILED DESCRIPTION OF PREFERRED EMBODIMENTS

Figure 1B:
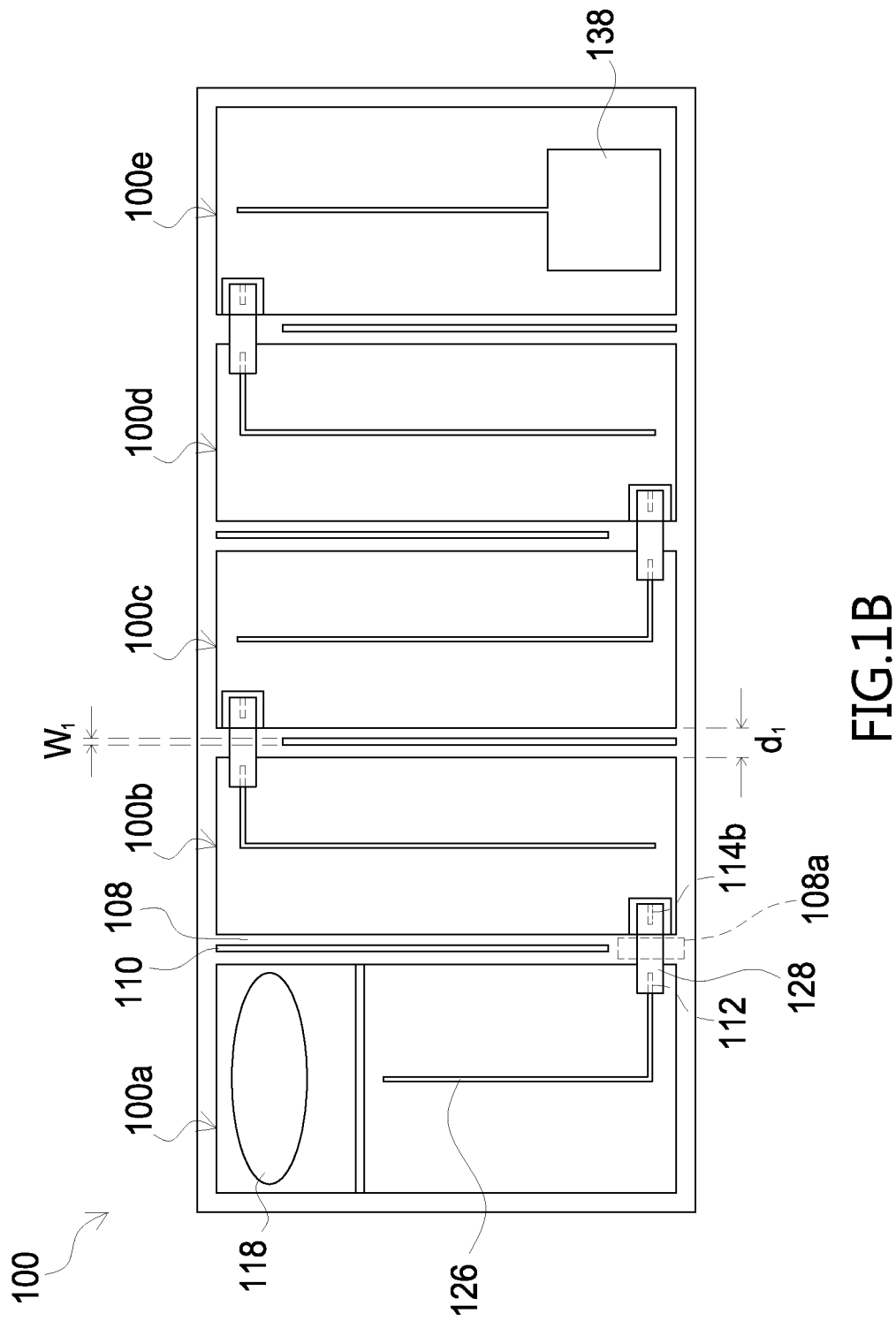

Referring to FIGS. 1A and 1B, an LED array in accordance with a first embodiment of the present application is disclosed, wherein FIG. 1A is a perspective drawing illustrating a partial side-view of the embodiment, and FIG. 1B illustrates a top-view of the embodiment. As shown in FIG. 1A, an LED array 100 includes: a first LED unit 100a having a first side 117; a second LED unit 100b having a second side 119 facing the first side 117 and being separated from the first LED unit 100a by a trench 108; a light-guiding structure 110 formed between the first LED unit 100a and the second LED unit 100b and is disposed in the trench 108; and a carrier 101 carrying the first LED unit 100a, the second LED unit 100b, and the light-guiding structure 110. The first LED unit 100a and second LED unit 100b can be grown from an original substrate (not shown) as a continuous epitaxy structure, and after attaching the continuous epitaxy structure to the carrier 101 by an adhesive layer 103, the trench 108, the first LED unit 100a and the second LED units 100b can be defined by removing a portion of the epitaxy structure. The light-guiding structure 110 can be simultaneously formed with the first LED unit 100a and the second LED unit 100b to have the same epitaxy structure as that of the first LED unit 100a and the second LED unit 100b, and in the embodiment, the light-guiding structure 110 can be a monolithic and stripe-like semiconductor stack formed along the trench 108. The first LED unit 100a includes a first light-emitting stack 105a comprising a lower semiconductor layer 102a, a first active layer 104a formed on the lower semiconductor layer 102a, and an upper semiconductor layer 106a formed on the active layer 104a. The second LED unit 100b includes a second light-emitting stack 105b comprising a lower semiconductor layer 102b, a second active layer 104b formed on the lower semiconductor layer 102b and an upper semiconductor layer 106b formed on the second active layer 104b.

In a conventional LED array having multiple LED units, each LED unit may absorb light laterally from other LED units, therefore the light extraction thereof is decreased. In the embodiment, the light-guiding structure 110 can be formed between the first LED unit 100a and second LED unit 100b, and the light supposes to be absorbed by LED units in conventional LED array can be partially absorbed by the light-guiding structure 110, or reflected between the light-guiding structure 110 and the first LED unit 100a and between the light-guiding structure 110 and the second LED unit 100b respectively to be guided away from the LED array.

As shown in FIG. 1B and further referring to FIG. 1A, the trench 108 includes an electrical-connection region 108a for electrically connecting the first LED unit 100a to the second LED unit 100b, and the electrical-connection region 108a does not have the light-guiding structure 110 thereon, and the first LED unit 100a includes a first contact 126 on the top surface 131 thereof, and the first contact 126 has an end 112 close to the electrical-connection region 108a of the trench 108. Furthermore, the second LED unit 100b includes a second contact 114b on the bottom surface 142 extended to the electrical-connection region 108a of the trench 108, and a conductive line 128 connecting the end 112 of the first contact 126 to the second contact 114b. The LED array 100 can further include a third LED unit 100c serially connected to the second LED unit 100b, a fourth LED unit 100d serially connected to the third LED unit 100c, and a fifth LED unit 100e serially connected to the fourth LED unit 100d. Nevertheless, the LED array 100 can also be connected in parallel or anti-parallel. The width d of the trench 108 can be between 6~10 µm, and the width $w_1$, the maximum width of the light-guiding structure 110, can be less than 6 µm. The second contact 114b of the second LED unit 100b can be extended from a patterned metal contact 120b on the lower semiconductor layer 102, and a semiconductor contact 122b can be formed between the patterned metal contact 120b and the lower semiconductor layer 102. The second contact 114a of the first LED unit 100a is the same with that of the second LED unit 100b and is on the bottom surface 141. In the embodiment, the LED array 100 includes five LED units connected in series, and the first LED unit 100a and the fifth LED unit 100e are at two ends of the LED array 100. The first LED unit 100a includes a first pad 118 electrically connected to the second contact 114a as shown in FIG. 1A, and the second contact 114a is extended from a metal contact 120a ohmic contacting to the lower semiconductor layer via a semiconductor contact layer 122a. The fifth LED unit 100e can be similar to the second LED unit 100b except including a second pad 138 on the upper surface, and the shape in top view of the first pad 118 is different from that of the second pad 138. The number of LED units is not limited to the disclosure of the embodiment, wherein the LED array 100 can have two or more LED units.

The LED units in the embodiment can be composed of materials such as the series of aluminum gallium indium phosphide (AlGaInP), the series of aluminum gallium indium nitride (AlGaInN), and/or the series of zinc oxide (ZnO). The active layer can be configured as a single heterostructure (SH), a double heterostructure (DH), a double-side double heterostructure (DDH), or a multi-quantum well (MQW) structure. The carrier can include transparent material such as Sapphire, diamond, glass, SiC, ZnO; reflective metal such as Cu, Al; heat-dissipation material such as graphite, diamond, diamond-like or ceramic. The material of the adhesive layer 103 can be insulative including polyimide, BCB, PFCB, epoxy, acrylic resin, COC, PMMA, PET, PC, polyetherimide, fluorocarbon polymer, silicone resin, glass, $Al_2O_3$, $SiO_2$, $TiO_2$, $SiN_x$, or SOG.

Furthermore, although in the embodiment the LED units are attached on the carrier 101 by the adhesive layer 103, the LED units can be also formed on the carrier 101 by epitaxial growth if the carrier 101 is a single-crystalline substrate and is insulative.

Figure 2B:
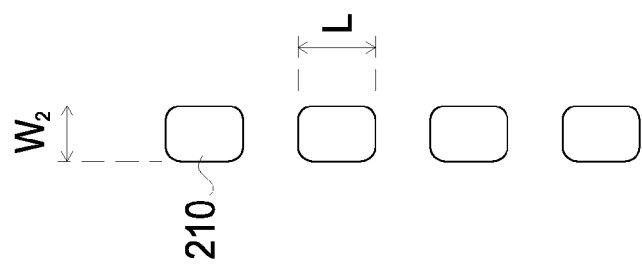
FIGS. 2A and 2B show an LED array in accordance with a second embodiment of the present application.
Figure 2A:
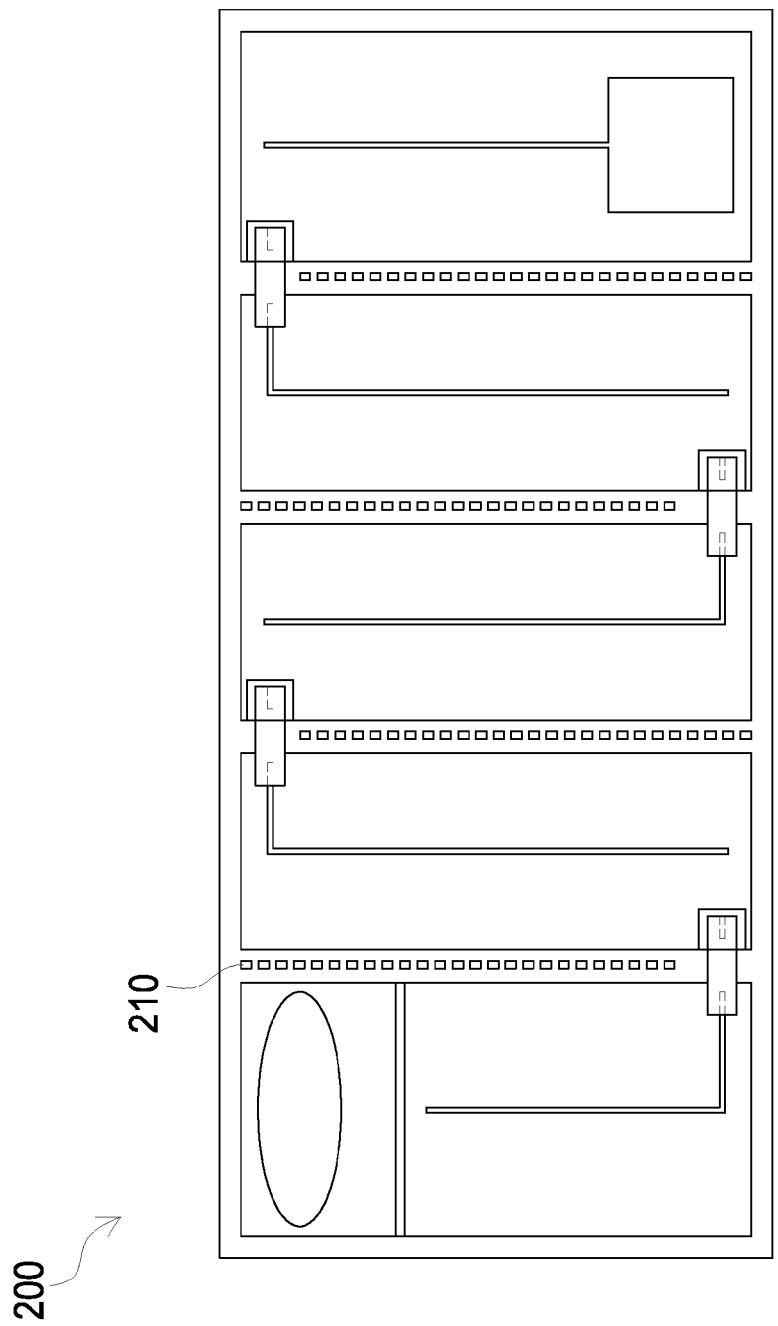

Referring to FIG. 2A, an LED array 200 in accordance with a second embodiment of the present application is disclosed. The difference between the second embodiment and the first embodiment is that the light-guiding structure of the embodiment includes a plurality of light-guiding rods 210 formed by separating the monolithic stripe-like semiconductor stack of first embodiment to multiple rod-like semiconductor stacks. As shown in FIG. 2B, the light-guiding rods 210 can be a string of rectangular from top view wherein each rectangular has a short side $w_2$ and a long side L perpendicular to the short side w2, and the width of the short side $w_2$ is less than 6 µm, and the long side L of each of the light-guiding rods 210 can be between 3 and 10 µm.

Figure 3:
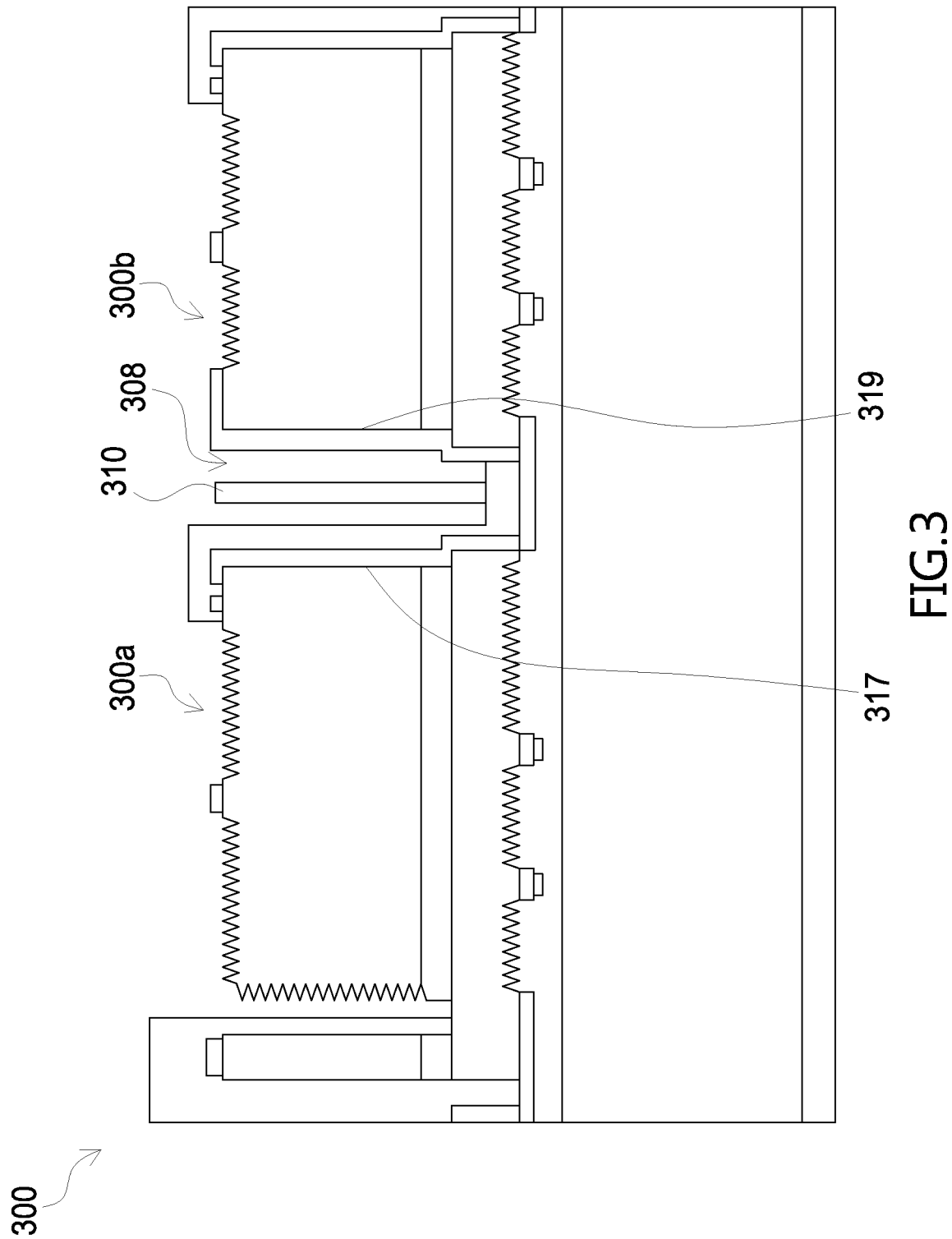
FIG. 3 shows an LED array in accordance with a third embodiment of the present application.

Referring to FIG. 3, an LED array in accordance with a third embodiment of the present application is disclosed, and FIG. 3 is a perspective drawing illustrating a partial side-view of the embodiment. The LED array 300 includes: a first LED unit 300a having a first side 317; a second LED unit 300b having a second side 319 and being separated from the first LED unit 300a by a trench 308; and a light-guiding structure 310 formed between the first LED unit 300a and second LED unit 300b. The light-guiding structure 310 can be similar to that of the first embodiment or second embodiment, and the difference between the third embodiment and the above embodiments is that the light-guiding structure 310 includes transparent material. The light-guiding structure 310 can be a transparent body being monolithic and stripe-like or a string of multiple transparent rods. The material of the light-guiding structure 310 can include $SiO_2$, $Al_2O_3$, SOG or other transparent material.

Figure 4A:
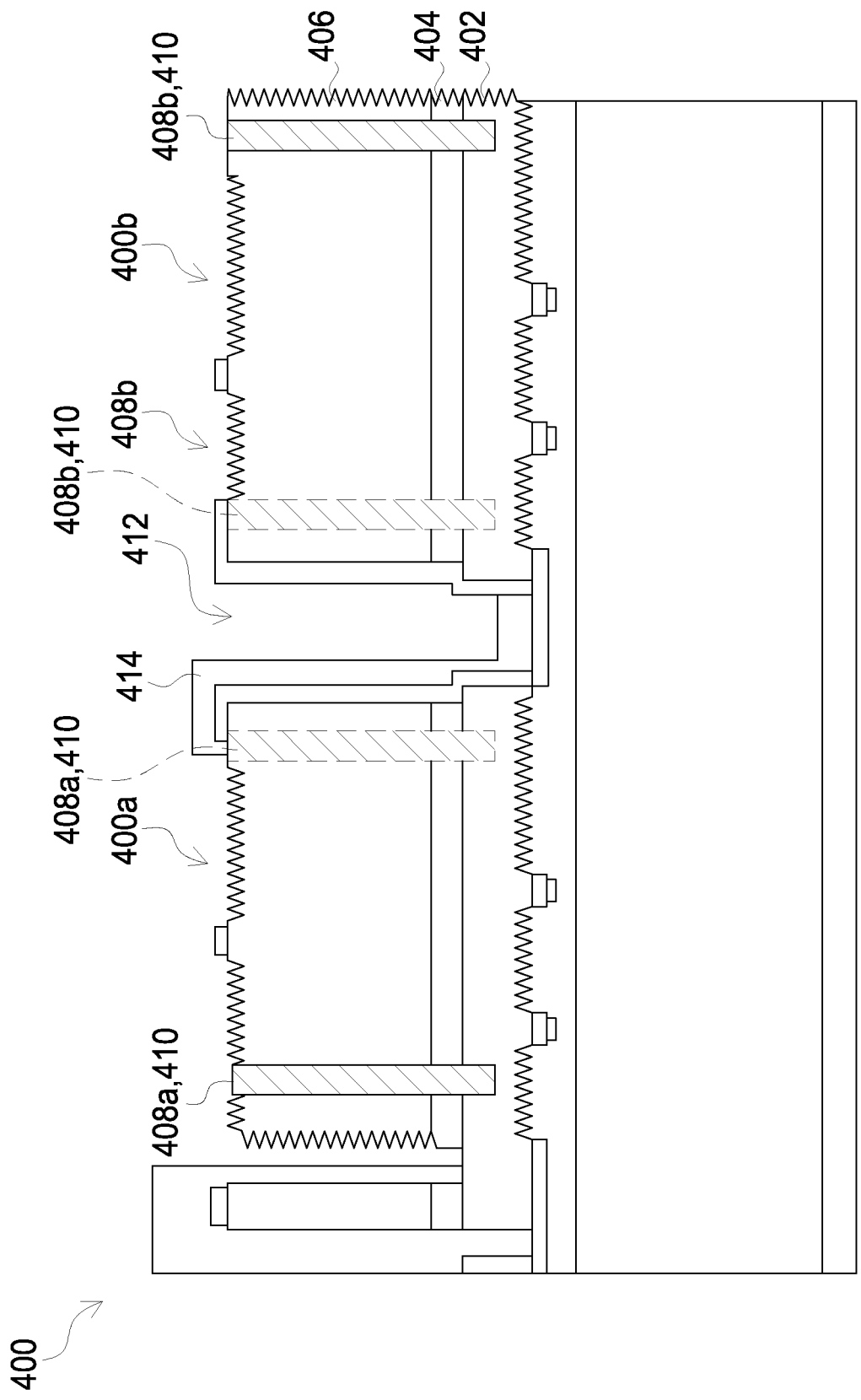
FIGS. 4A and 4B show an LED array in accordance with a fourth embodiment of the present application.
Figure 4B:
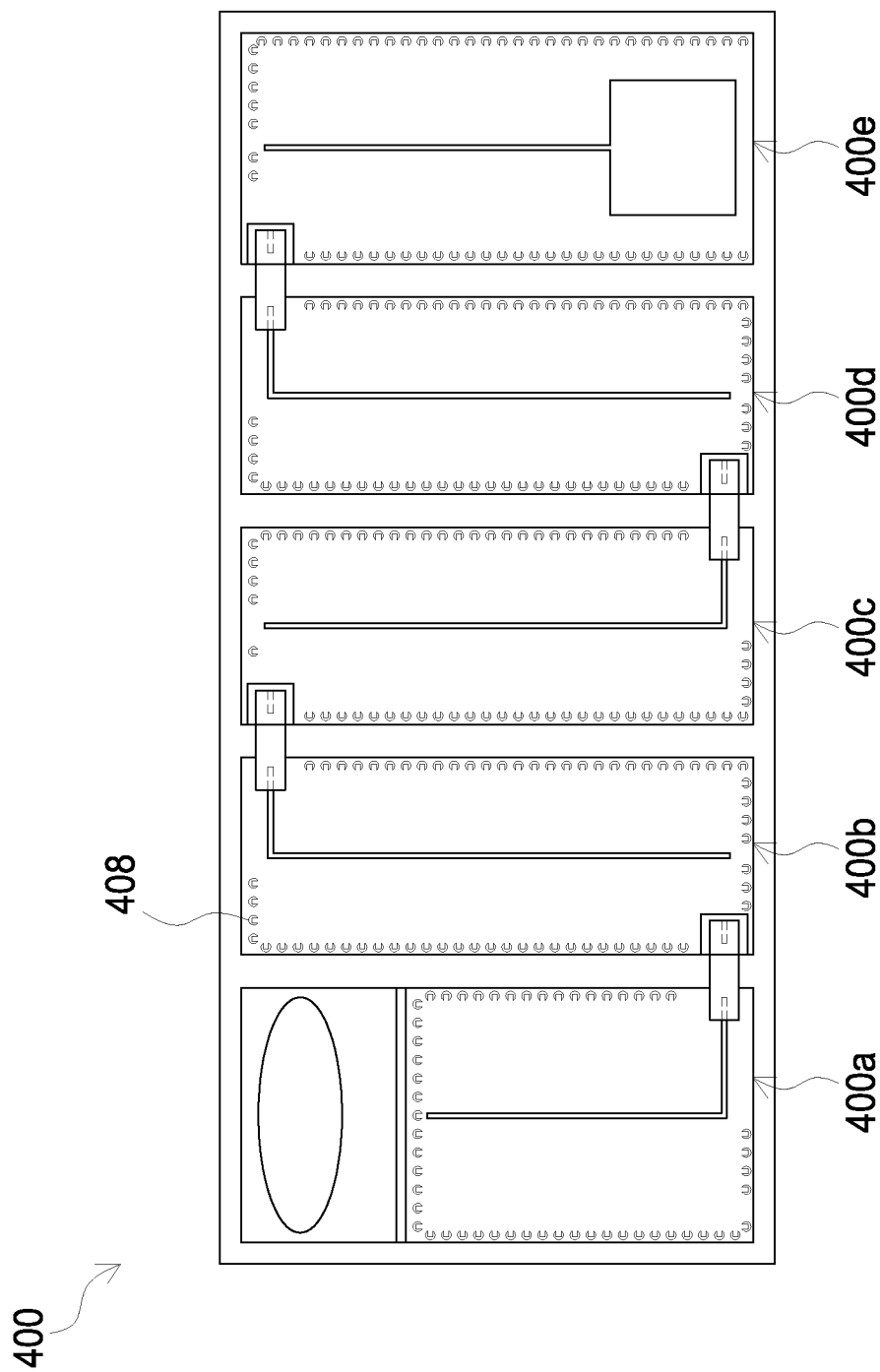

Referring to FIGS. 4A and 4B, an LED array in accordance with a fourth embodiment of the present application is disclosed. The LED array 400 includes: a first LED unit 400a; a second LED unit 400b separated from the first LED unit 400a by a trench 408. The difference between the fourth embodiment and the above embodiments is that the light-guiding structure 408 is formed within each LED unit. Each of the first LED unit 400a and the second LED unit 400b comprises a lower semiconductor layer 402, an active layer 404 formed on the lower semiconductor layer 402, and an upper semiconductor layer 406 formed on the active layer 404, and a plurality of first light-guiding channels 408a and second light-guiding channels 408b penetrates from the upper surface of the upper semiconductor layer 406 to the lower semiconductor layer respectively, and the first light-guiding channels 408a and second light-guiding channels 408b penetrate the lower semiconductor layer 402 to a depth smaller than the thickness of the lower semiconductor layer 402. The first light-guiding channels 408a and second light-guiding channels 408b can also be filled with a transparent insulating material to enhance light-guiding effect. As shown in FIG. 4B, the shape of top view of each of the first light-guiding channels 408a or the second light-guiding channels 408b is C-shape. Nevertheless, the shape of cross-sectional view of each of the first light-guiding channels 408a or the second light-guiding channels 408b can be circular, triangular, or rhombus. Similar to the first embodiment, the LED array 400 can further have a third LED unit 400c, a fourth LED unit 400d and a fifth LED unit 400e.

Figure 5A:
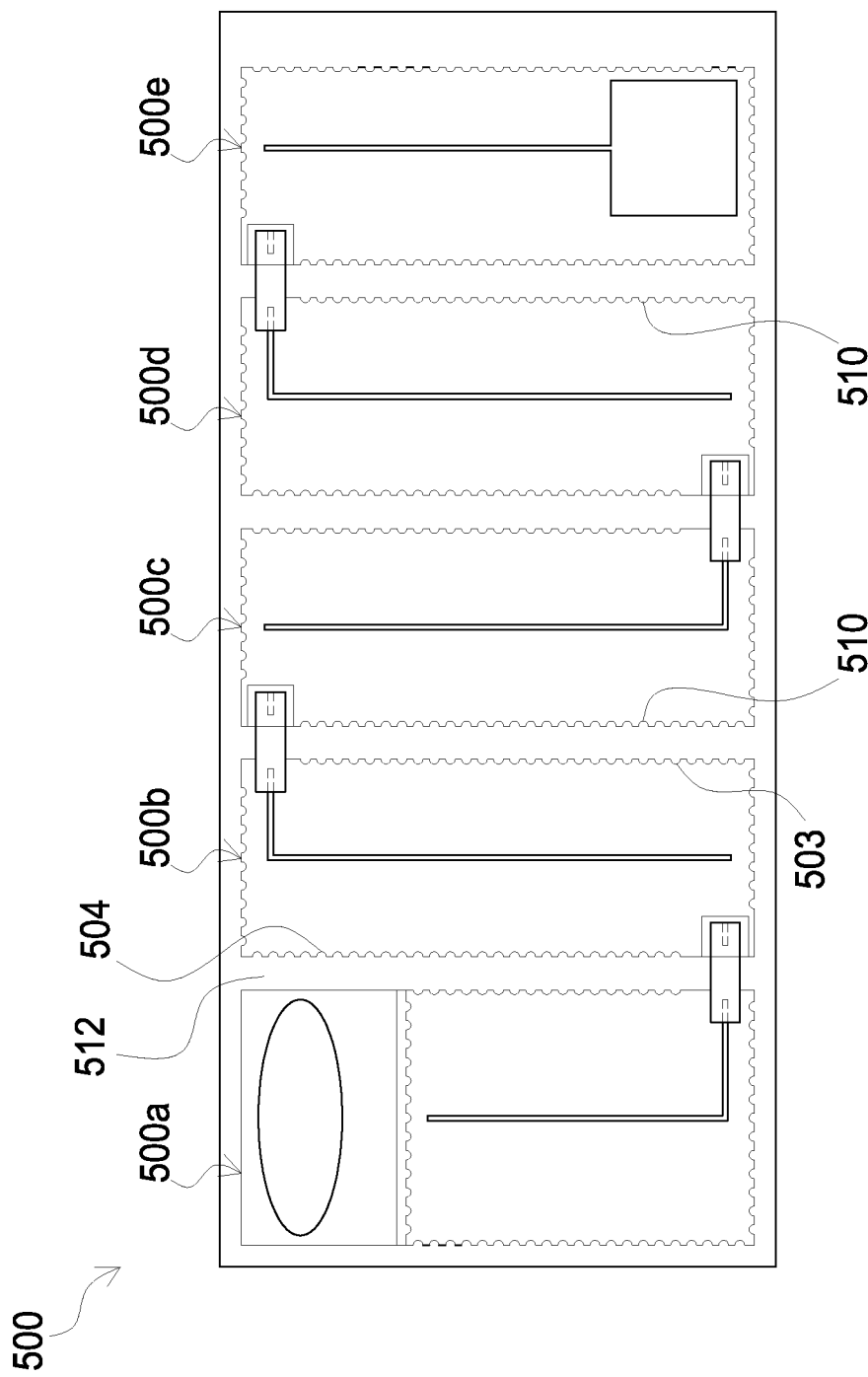
FIGS. 5A and 5B show an LED array in accordance with a fifth embodiment of the present application.
Figure 5B:
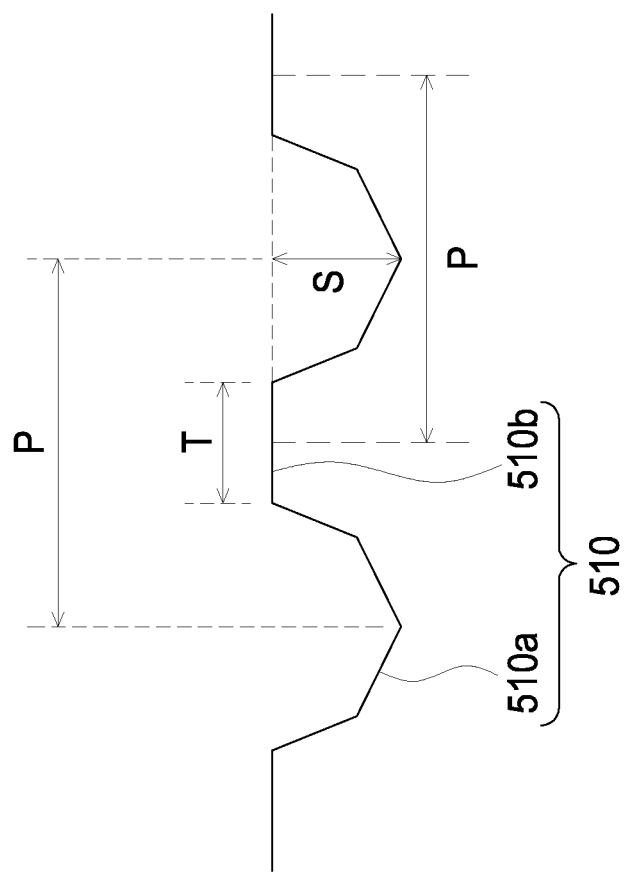
Figure 7:
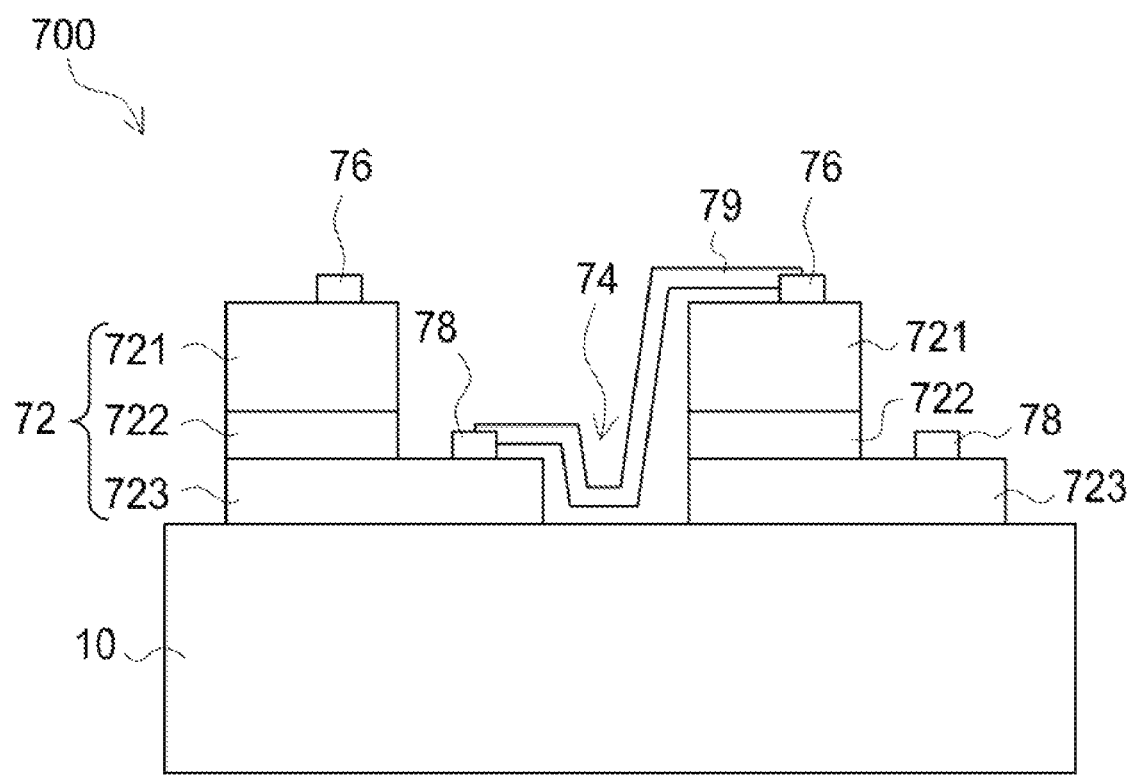
FIG. 7 shows an LED array in accordance with conventional art.

Referring to FIGS. 5A and 5B, an LED array in accordance with a fifth embodiment of the present application is disclosed. The difference of the embodiment is that the light-guiding structure 510 is disposed on the side surface of each LED unit as a periodic or random uneven structure. The LED array 500 includes LED units 500a, 500b, 500c, 500d, and 500e. As demonstrated by the LED units 500a and 500b, a trench 512 is formed between them, and a first side 503 of the first LED unit 500a is opposite to a second side 504 of the second LED unit 500b.

As shown in FIG. 5B, the light-guiding structure 510 can have uneven structure with a period P of about 9 µm and 15 µm. The light-guiding structure 510 has a full concave 510a or convex 510b within one period P, and the depth S of the concave 510a can be between 3 µm and 5 µm, and a width T of the convex 510b can be between 3 µm and 5 µm. The light-guiding structure 510 of the embodiment can also combine to above embodiments to guide more light to the front side of the LED array of each embodiment.

Referring to FIGS. 6A and 6B, a light bulb in accordance with a sixth embodiment of the present application is disclosed. The bulb 600 includes a cover 602, a lens 604, a lighting module 610, a lamp holder 612, a heat sink 614, a connecting part 616, and an electrical connector 618. The lighting module 610 includes a carrier 606 and a plurality of light-emitting elements 608 of any one of the above mentioned embodiments on the carrier 606.

Although the present application has been explained above, it is not the limitation of the range, the sequence in practice, the material in practice, or the method in practice. Any modification or decoration for present application is not detached from the spirit and the range of such.

What is claimed is:

1. A light-emitting device comprising:
a light-emitting stack having a surrounding side; and
a plurality of light-guiding channels within the light-emitting stack and formed along the surrounding side, and each of the light-guiding channels is a C-shaped outline from top view, wherein one of the light-guiding channels is filled with a transparent insulating material and an opening of the C-shaped outline is toward a center of the light-emitting stack from top view.

2. The light-emitting device according to claim 1, further comprising:
a first LED unit having a first active layer and a first side comprising a plurality of first uneven surfaces and first even surfaces arranged alternately to compose a first light-guiding structure;
a second LED unit having a second active layer and a second side comprising a plurality of second uneven surfaces facing the first side;
a trench physically separating the first LED unit from the second LED unit and between the first side and the second side; and
a connector covering one of the first even surfaces and electrically connecting the first LED unit and the second LED unit.

3. The light-emitting device according to claim 2, wherein the first uneven surfaces are arranged with a period of about 3 µm to 5 µm, and a depth of one of the first uneven surface is between 3 µm and 5 µm.

4. The light-emitting device according to claim 2, wherein the second side comprises a plurality of second even surfaces, and the second uneven surfaces and the second even surfaces are arranged alternately to compose a second light-guiding structure.

5. The light-emitting device according to claim 2, wherein each of the first uneven surfaces comprises a concave.

6. The light-emitting device according to claim 5, wherein the concave comprises a plurality of surfaces, wherein slopes of two of the adjacent surfaces are different from top view.

7. An LED array comprising:
a first LED unit having a first active layer and a first side;
a second LED unit having a second active layer and a second side facing the first side;
a trench physically and electrically separating the first LED unit from the second LED unit;
a connection structure, formed in the trench, covering a part of the first LED, and electrically connecting the first LED unit to the second LED unit; and
a light-guiding structure formed between the first LED unit and the second LED unit for guiding the light emitted by the first active layer and the second active layer away from the LED array;
wherein the light-guiding structure comprises a plurality of light-guiding channels within the first LED unit and along the first side, and each of the light-guiding channels has a C-shaped outline from top view, and
wherein one of the plurality of light-guiding channels is filled with a transparent insulating material, and an opening of the C-shaped outline is toward a center of the light-emitting stack from top view.

8. The LED array according to claim 7, wherein the first LED unit further comprises a lower semiconductor layer on which the first active layer is formed and an upper semiconductor layer formed on the first active layer, the plurality of light-guiding channels extends from an upper surface of the upper semiconductor layer to the lower semiconductor layer, and/or the plurality of light-guiding channels penetrate the lower semiconductor layer to a depth smaller than the thickness of the lower semiconductor layer.

* * * * *